(12) United States Patent
Segers et al.

(10) Patent No.: US 6,404,483 B1
(45) Date of Patent: Jun. 11, 2002

(54) SUBSTRATE HANDLER FOR USE IN LITHOGRAPHIC PROJECTION APPARATUS

(75) Inventors: Hubert M. Segers, 's Hertogenbosch; Rudolf M. Boon, Eindhoven; Anton A. Bijnagte, Tricht; Fransiscus M. Jacobs, Asten, all of (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/552,671

(22) Filed: Apr. 19, 2000

(30) Foreign Application Priority Data

Apr. 21, 1999 (EP) .............................. 99201223

(51) Int. Cl.⁷ ...................... G03B 27/42; G03B 27/58; G03B 27/32; A61N 5/00; G03L 5/00
(52) U.S. Cl. ............................ 355/53; 355/72; 355/74; 355/77; 250/492.2; 430/311; 430/312
(58) Field of Search ............................. 355/53, 72, 77, 355/74; 250/492.2; 430/311, 312

(56) References Cited

U.S. PATENT DOCUMENTS

| 3,865,254 | A |   | 2/1975  | Johannsmeier |
|-----------|---|---|---------|--------------|
| 4,655,584 | A |   | 4/1987  | Tanaka et al. |
| 5,953,105 | A | * | 9/1999  | Van Engelen et al. ........ 355/53 |
| 5,972,110 | A | * | 10/1999 | Akimoto ...................... 118/52 |
| 6,232,615 | B1 | * | 5/2001 | Van Empel .................. 250/548 |

FOREIGN PATENT DOCUMENTS

WO                98/40791          9/1998

* cited by examiner

*Primary Examiner*—Russell Adams
*Assistant Examiner*—Khaled Brown
(74) *Attorney, Agent, or Firm*—Pillsbury Winthrop LLP

(57) ABSTRACT

A pre-aligner receives wafers from a wafer carrier or process track and performs preparatory steps such as centering of the wafer. The prepared wafer is transferred to the wafer table using a robot arm that is isolated from the pre-aligner and the wafer table. The robot arm couples to the pre-aligner to pick up the wafer, decouples, couples to the wafer table and deposits the wafer. Positional accuracy of the wafer is thereby maintained during the transfer.

10 Claims, 7 Drawing Sheets

SUBSTRATE HANDLER FOR USE IN LITHOGRAPHIC PROJECTION APPARATUS

BACKGROUND IF THE INVENTION

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam, and such elements may also be referred to below, collectively or singularly, as a "lens".

Lithographic projection apparatus can be used, for example, in the manufacture of integrated circuits (ICs). In such a case, the mask (reticle) may contain a circuit pattern corresponding to an individual layer of the IC, and this pattern can be imaged onto an exposure area (die) on a substrate (silicon wafer) which has been coated with a layer of photosensitive material (resist). In general, a single wafer will contain a whole network of adjacent dies, which are successively irradiated via the reticle, one at a time. In one type of lithographic projection apparatus, each die is irradiated by exposing the entire reticle pattern onto the die at once; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the substrate table (wafer table) parallel or anti-parallel to this direction; since, in general, the projection system will have a magnification factor M (generally <1), the speed V at which the wafer table is scanned will be a factor M times that at which the mask table (reticle table) is scanned. More information with regard to lithographic devices as here described can be gleaned from International Patent Application WO97/33205, for example.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at a exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

In a known lithography apparatus, substrates for exposure—such as wafers—can be first loaded from a wafer carrier or process track into a pre-align module, so as to prepare the substrates for exposure. One of the most important aspects of such preparation is a pre-alignment step. In this step, the wafer is placed on a pre-aligner turntable and its edge inspected by rotating it past an edge sensor, which may comprise an optical or capacitive sensor, for example. This enables automatic location of the notch or flat edge of the wafer, and also allows the eccentricity of the wafer on the turntable to be measured. In this way:

- the notch or flat edge can be automatically oriented as desired, before the wafer is transferred to the substrate table;
- It can be determined if the eccentricity of the wafer exceeds a threshold value which, when translated to the substrate table, would cause the wafer to fall outside the capture range of an alignment module employed at the substrate table. If such is the case, then the wafer can first be shifted on the turntable by a pre-calculated amount, so as to bring it within the threshold value.

Once these steps have been performed, a substrate handler can remove the wafer from the turntable and place it on the wafer table with a precision which will allow wafer capture by the alignment module.

However, the present inventors have determined that the various activities of the pre-aligner are a source of undesirable vibrations which can induce overlay errors if pre-alignment steps are carried out whilst another wafer is being exposed. It is undesirable to not perform pre-alignment concurrently with exposures as this reduces throughput. Also, if the pre-aligner is mechanically isolated from the wafer table to prevent transmission of vibration, their relative position will no longer be certain to a sufficient accuracy to allow the substrate handler to transfer the wafer to the wafer table with the required precision.

SUMMARY OF THE INVENTION

An object of the present invention is to provide a substrate handler capable of transferring substrates from a pre-aligner to a substrate table in a lithographic projection apparatus whilst avoiding the transmission of vibrations to the substrate table when pre-alignment steps are carried out on one substrate concurrently with exposure of another substrate.

According to the present invention there is provided a lithographic projection apparatus comprising:

- a radiation system constructed and arranged to supply a projection beam of radiation;
- a mask table provided with a mask holder for holding a mask;
- a substrate table provided with a substrate holder for holding a substrate;
- a projection system constructed and arranged to image an irradiated portion of the mask onto a target portion of the substrate;
- a pre-aligner constructed and arranged to transfer out an initial alignment of a substrate; and
- a substrate handler constructed and arranged to transfer a substrate from said pre-aligner to said substrate table;
- said pre-aligner is mechanically isolated from said substrate table; and
- coupler constructed and arranged to coupler said substrate handler to said substrate table at a known relative position.

Because the pre-aligner of the present invention is mechanically isolated from the substrate table, which carries the substrate during exposure processes, vibrations caused by the pre-alignment steps are not transmitted to the substrate during exposure. To provide positional accuracy in the transfer of substrates, the substrate handler couples to the substrate table to define its position relative thereto and only then deposits the substrate in the substrate holder. The substrate handler can have a fixed position relative to the pre-aligner or may be mechanically isolated from it as well and couple to it to pick up the substrate. Coupling to the pre-aligner ensures that, even if the substrate handler is isolated from the pre-aligner, it is at a known, e.g. predetermined, position relative to the pre-aligner when the substrate is picked up so that it will be held in the substrate handler at a known position. Similarly, when the substrate handler is coupled to the substrate table, its relative position is known and the positional accuracy of the substrate when in the pre-aligner is preserved in the transfer. If the substrate handler couples to both the substrate table and the pre-aligner, its relative position is known relative to the pre-aligner when the substrate is picked up from that pre-aligner and its relative position is known relative to the substrate table when the substrate is deposits, such that the accuracy of the pre-aligning is maintained during the transfer.

In preferred embodiments, when the substrate handler approaches the pre-aligner or substrate table their relative positions are known only coarsely. Once the substrate handler has made an initial contact with the pre-aligner or substrate table, an automatic coupling mechanism brings the two together in a predetermined physical relationship. This can be achieved using an end-effector member on the substrate handler, which is loosely coupled to the substrate handler. The end-effector member carries half of a coupling which mates with corresponding halves on the pre-aligner and substrate table. The two halves of the coupling are mechanically biased to take up the correct position on coupling, without the necessity for the substrate handler as a whole to be as accurately aligned to the substrate table.

According to a further aspect of the present invention there is provided a method of manufacturing a device comprising:

providing a mask bearing a pattern to a mask table;

providing a substrate having a radiation-sensitive layer to a pre-aligner and preparing it for exposure;

transferring said substrate from a pre-aligner to said substrate table using a substrate handler; and imaging irradiated portions of the mask onto target portions of the substrate;

said transferring said substrate from said pre-aligner comprises:
  picking up said substrate from said pre-aligner;
  coupling said substrate handler to said substrate table; and
  placing said substrate in said substrate holder of said substrate table.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices (dies) will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "exposure area", respectively.

In the present document, the terms "radiation" and "beam" are used to encompass all types of electromagnetic radiation or particle flux, including, but not limited to, ultraviolet radiation (e.g. at a wavelength of 365 nm, 248 nm, 193 nm, 157 nm or 126 nm), extreme ultraviolet radiation (EUV), X-rays, electrons and ions. Also herein, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface, rather than implying any particular orientation of the apparatus.

BRIEF DESCRIPTION OF THE DRAWINGS

The present invention will be described below with reference to exemplary embodiments and the accompanying schematic drawings, in which.

In the drawings, like references indicate like parts.

DETAILED DESCRIPTION OF THE EMBODIMENTS

Embodiment 1

Figure 1:
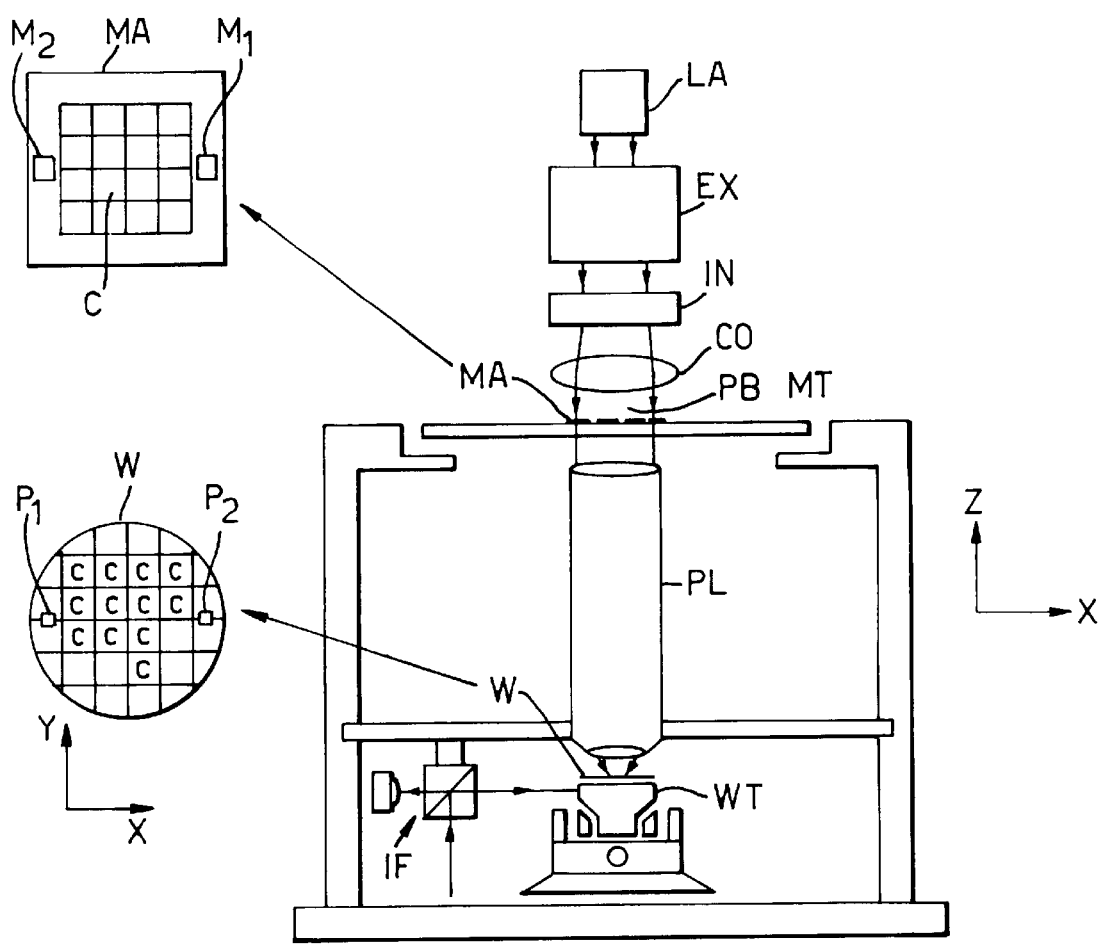
FIG. 1 depicts a lithographic projection apparatus according to a first embodiment of the invention.

FIG. 1 schematically depicts a lithographic projection apparatus according to the invention. The apparatus comprises:

a radiation system LA, Ex, IN, CO for supplying a projection beam PB of radiation (e.g. UV or EUV radiation, electrons or ions);

a mask table MT provided with a mask holder for holding a mask MA (e.g. a reticle), and connected to first positioning means for accurately positioning the mask with respect to item PL;

a substrate table (wafer table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto an exposure area C (die) of a substrate W held in the substrate table WT.

As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, a laser plasma source or an electron or ion beam source) which produces a beam of radiation and an illumination system. The beam is passed along various optical components comprised in the illumination system—e.g. beam shaping optics Ex, an integrator IN and a condenser CO—so that the resultant beam PB has a desired shape and intensity distribution in its cross-section.

The beam PB subsequently intercepts the mask MA which is held in the mask holder on the mask table MT. Having passed through the mask MA, the beam PB passes through the lens PL, which focuses the beam PB onto an exposure area C of the substrate W. With the aid of an interferometric displacement and measuring means IF, the substrate table WT can be moved accurately by the second positioning means, e.g. so as to position different exposure areas C in the path of the beam PB. Similarly, the first positioning means can be used to accurately position the mask MA with respect to the path of the beam PB, e.g. after mechanical retrieval of the mask MA from a mask library. In general, movement of the mask table MT and substrate table WT will be realized with the aid of a long-stroke module (course positioning) and a short-stroke module (fine positioning), which are not explicitly depicted in FIG. 1. In the case of a waferstepper (as opposed to a step-and-scan apparatus) the mask table MT may be connected only to a short-stroke positioning device or may be just fixed.

The depicted apparatus can be used in two different modes:

1. In step-and-repeat (step) mode, the mask table MT is kept essentially stationary, and an entire mask image is projected at once (i.e. a single "flash") onto an exposure area C. The substrate table WT is then shifted in the X and/or Y directions so that a different exposure area C can be irradiated by the beam PB;
2. In step-and-scan (scan) mode, essentially the same scenario applies, except that a given exposure area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is moved in the same or opposite direction at a speed V=Mv, in which M is the magnification of the lens PL (typically, M=¼ or ⅕). In this manner, a relatively large exposure area C can be exposed, without having to compromise on resolution.

Figure 2:
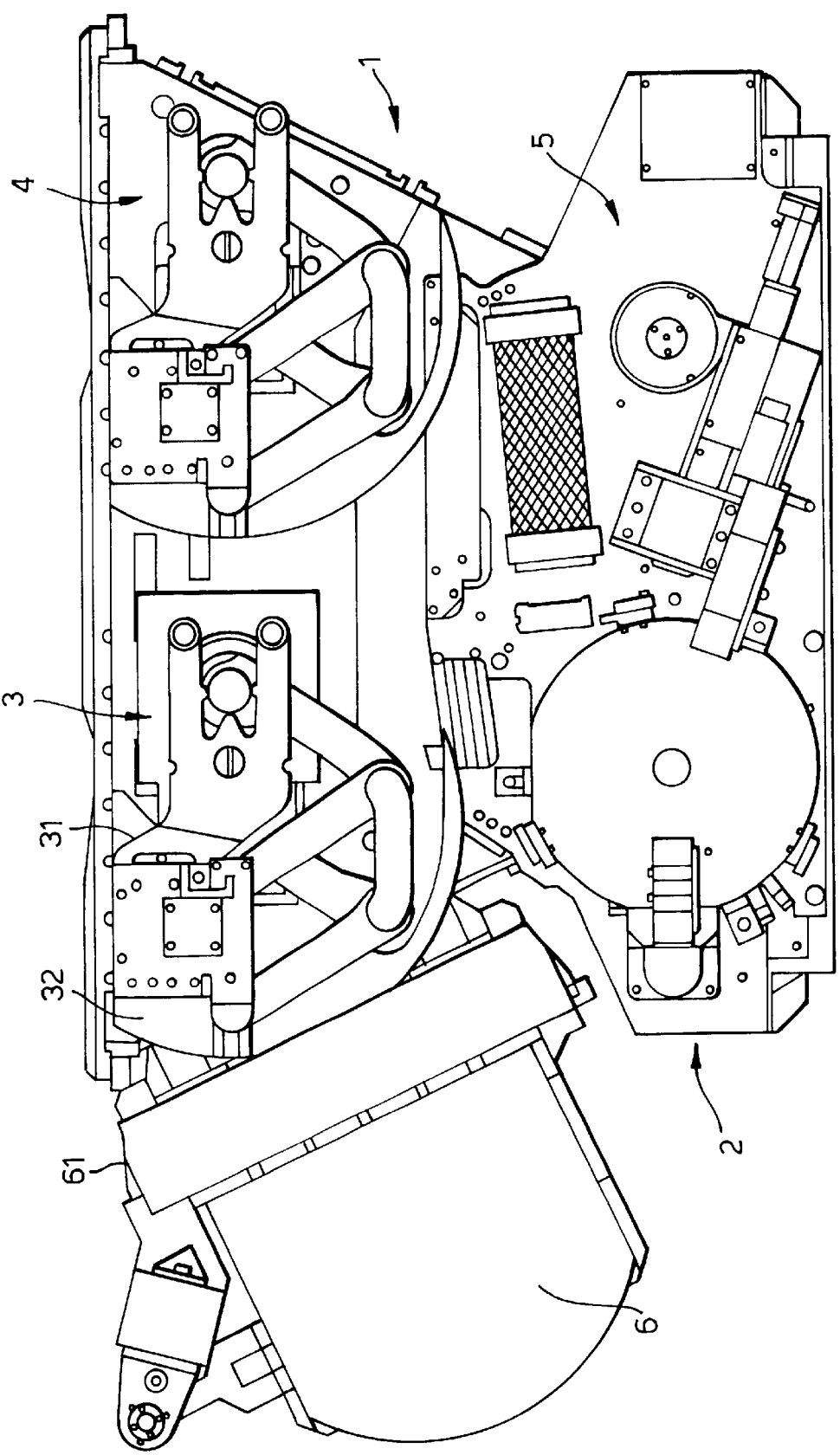
FIG. 2 depicts a pre-aligner and substrate handler of the first embodiment.

FIG. 2 shows a pre-align unit 1 comprising a pre-aligner 2 and wafer handling components. After a wafer has been transferred from a wafer carrier or process track to the pre-aligner 2, the pre-alignment process is started. Pre-alignment may include wafer edge detection, e.g. using an optical sensor, wafer centering and temperature conditioning. The pre-alignment process and pre-aligner are described further in a concurrently filed application entitled "Lithographic Projection Apparatus" (Applicant's reference P-0135.010), for example.

Once pre-alignment is complete, the wafer is transferred to a wafer table WT by a load robot 3 (the "substrate handler"). The load robot 3 is equipped with an independent and separate trajectory safeguard system in order to prevent wafer breakage. During operation of the load robot 3, measured absolute position and derived velocity of the load robot 3 are compared with permitted position and velocity. Remedial action can be taken in the event of divergence. The position of the wafer on the pre-aligner 2 is known with high accuracy and it must be placed on the wafer table WT with the required accuracy, i.e. within the capture range of the alignment system employed at the wafer table WT. To this end, the load robot 3 is provided with a docking unit (the "coupling means") 31 which couples to the pre-aligner 2 when taking up the wafer W and to the wafer table WT when putting it down. The docking unit 31 may be of the ball/groove kinematic coupling type with the ball provided on the docking unit 31 and grooves on the pre-aligner 2 and wafer table WT. Preferably, the docking unit 31 couples to the pre-aligner 2 and wafer table WT at two spaced apart positions. For safety reasons the rotating part of the load robot 3 is provided with a light shield 32 to prevent any stray light from the exposure position escaping to the pre-align unit 1 or process track.

After full exposure, an unload robot 4 transfers the wafer W from the wafer table WT to a discharge station 5. The unload robot 4 may be constructed similarly to the load robot 3, but does not have such high accuracy requirements. The wafer W is taken from the discharge station 5, also referred to as the pedestal, to the wafer carrier 6 or process track. The unload robot 4 can also be used to load wafers from the pre-aligner 2 to the wafer table WT. Conversely, the load robot 3 can also be used to transfer wafers from the wafer table WT to the discharge station 5 or the wafer carrier 6.

The pre-align unit 1 may further be provided with a carrier handler 61 which enables the use of different types of wafer carriers, such as 200 mm and 300 mm cassette carriers. The carrier handler 61 can be configured on either the left or right side of the lithographic projection apparatus and arranges for accepting and (if applicable) locking the wafer carrier 6, inspecting and indexing the wafer carrier 6 and (if applicable) opening the carrier 6 and removing wafers. The carrier handler 61 can be used to store rejected wafers or wafers that need further processing, in the wafer carrier 6.

Figure 3:
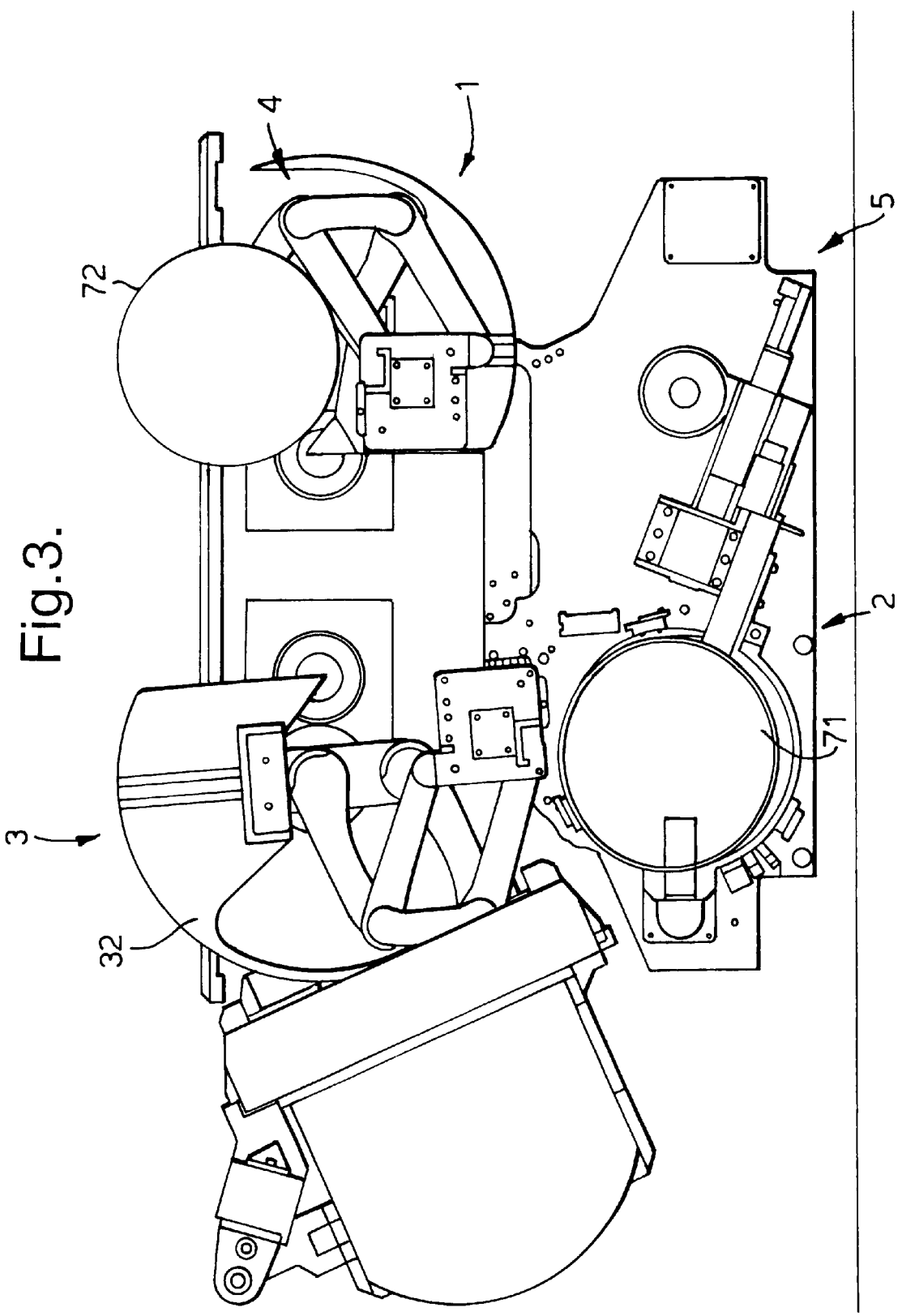
FIG. 3 depicts the pre-aligner and substrate handler of the first embodiment with a wafer placed on the pre-aligner.

In FIG. 3, the pre-align unit 1 is shown in a first loaded position. In this position, the pre-aligner 2 contains a wafer 71, which has been pre-aligned and conditioned, while the load robot 3 is positioned to transfer the wafer 71, after half rotation of the load robot 3, to the wafer table WT. The unload robot 4 carries a wafer 72, which has been removed from the wafer table WT after exposure, and which, after half rotation of the unload robot 4, will be transferred to the discharge station 5.

Figure 4:
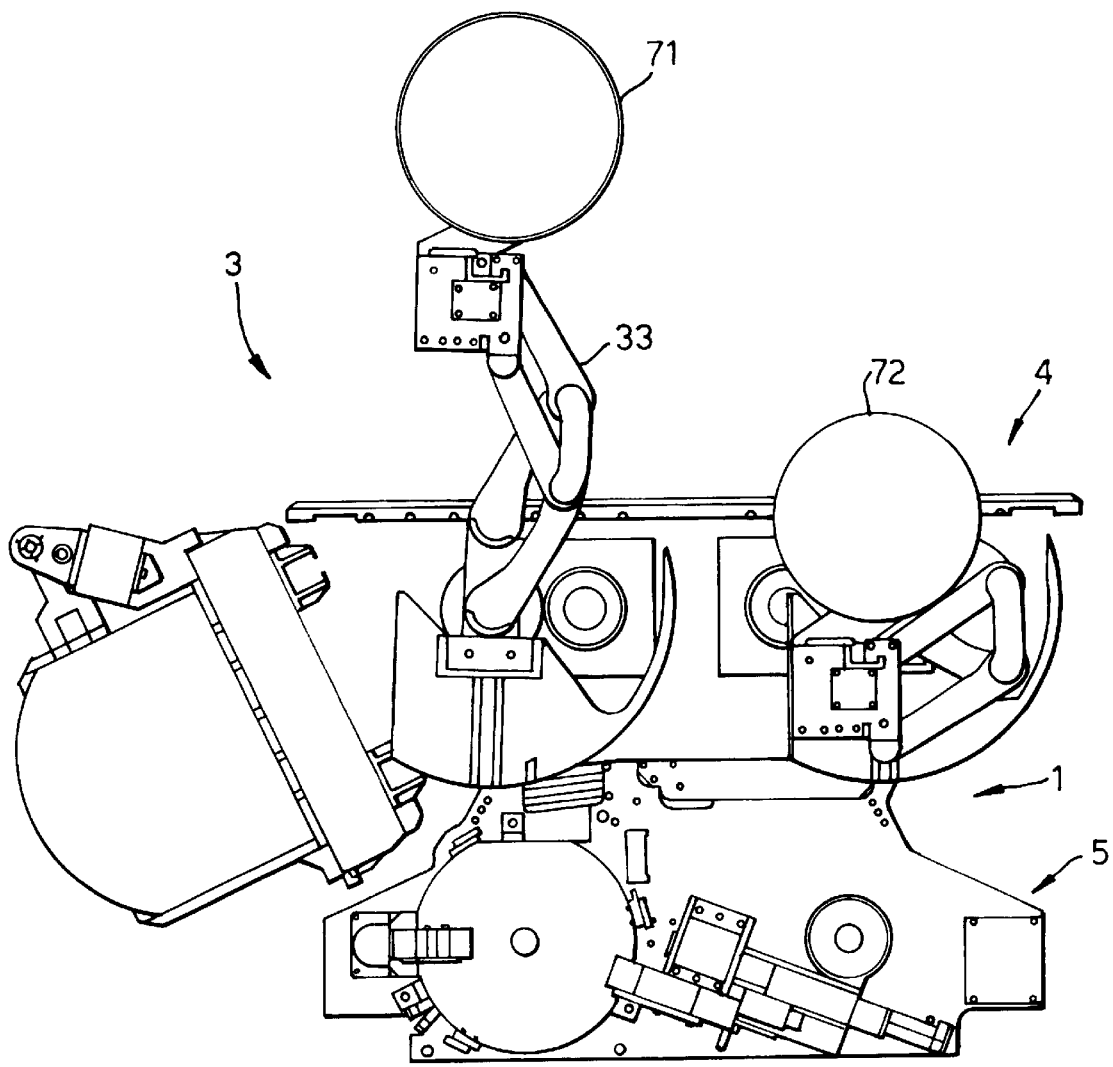
FIG. 4 depicts the pre-aligner and substrate handler of the first embodiment with a wafer on the substrate handler, which is extended.

In FIG. 4, the same pre-align unit 1 is shown but with arm 33 of the load robot 3 extended for transfer of wafer 71 to the wafer table WT. The exposed wafer 72 is still on the unload robot 4.

Embodiment 2

FIGS. 5A to 5C, 6A and 6B show schematically a load robot (substrate handler) 130 of a second embodiment of the invention. Functionally, and save as described below, the second embodiment is the same as the first embodiment.

Figure 5A:
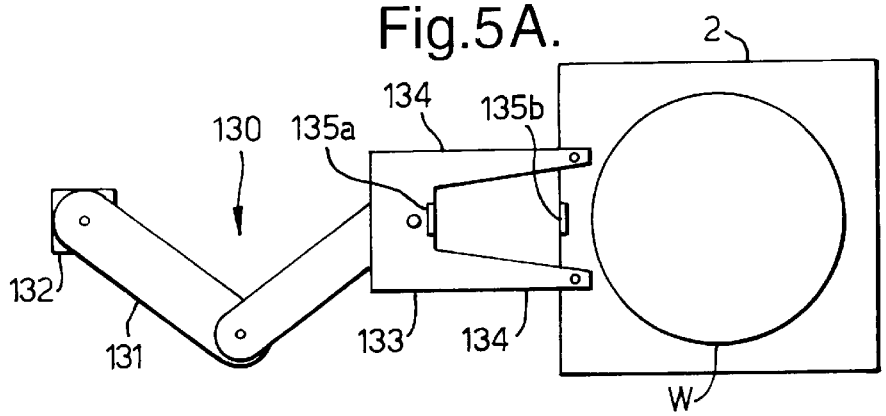
FIGS. 5A to 5C depict a pre-aligner and substrate handler of a second embodiment of the invention.
Figure 5B:
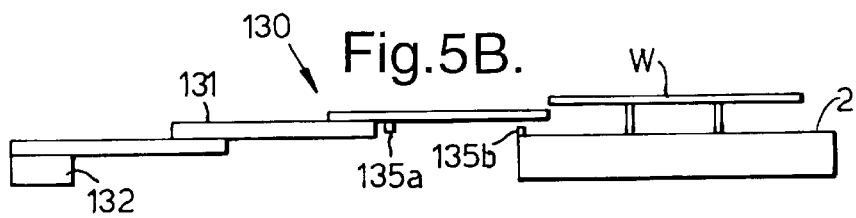
Figure 5C:
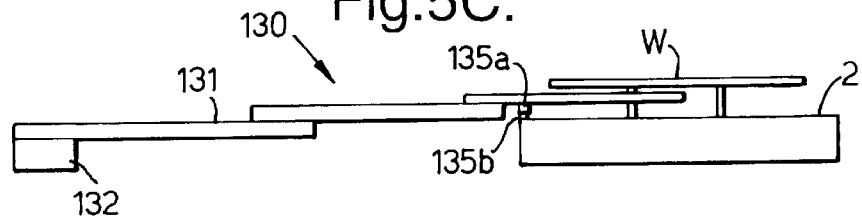

The load robot 130 comprises a two-part arm 131 which is rotatable mounted to base 132 so that the arm can extend from the position shown in FIGS. 5A and B to reach a pre-aligner 2, as shown in FIG. 5C, and a wafer table. A pick-up hand 133 is provided on the end of arm 131 and has two fingers 134 which are inserted underneath wafer W, as shown in FIG. 5C, to pick-up the wafer W. The pick-up hand 133 also carries one coupling half 135a of which mates with a corresponding coupling half 135b (the "coupling means") provided on the pre-aligner 2. The coupling 135a, 135b is used to ensure that the pick-up hand 133 is accurately positioned relative to the pre-aligner 2 when the wafer W is picked up. The connection between the pick-up hand 133 the and arm 131 allows a certain amount of movement between them so that the pick-up hand can be moved into correct alignment by the coupling 135a, 135b even if the arm 131 is not perfectly aligned. Hence, the wafer is accurately positioned on the pick-up hand 133 and can be placed on the wafer table WT with corresponding accuracy.

Figure 6A:
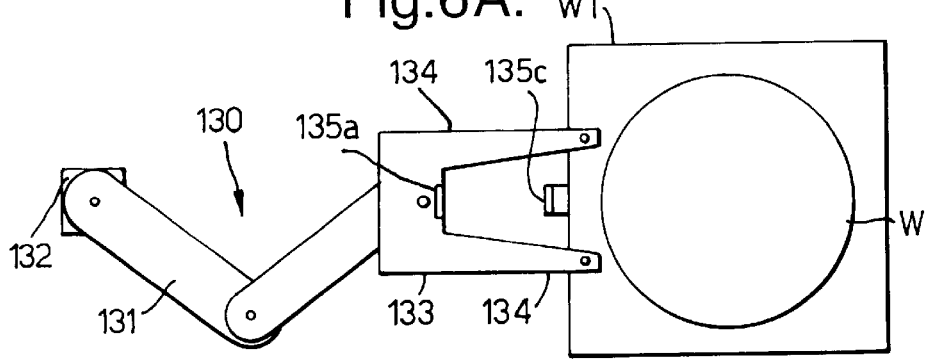
FIGS. 6A and 6B depict the substrate handler and wafer table of the second embodiment of the invention.
Figure 6B:
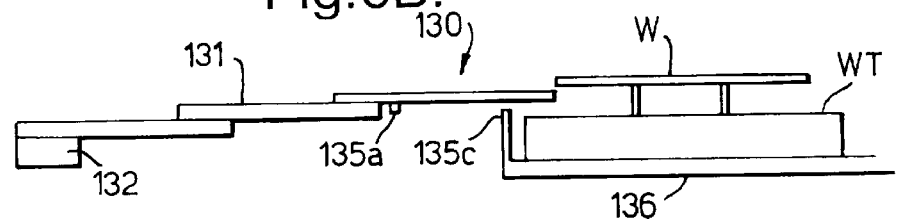

FIGS. 6A and B show the wafer table WT which is moveable. As such it can be brought to a predetermined position relative to a fixed member 136 which carries another half coupling 135c to mate with the coupling half 135a provided on the pick-up hand 133.

Embodiment 3

Figure 7:
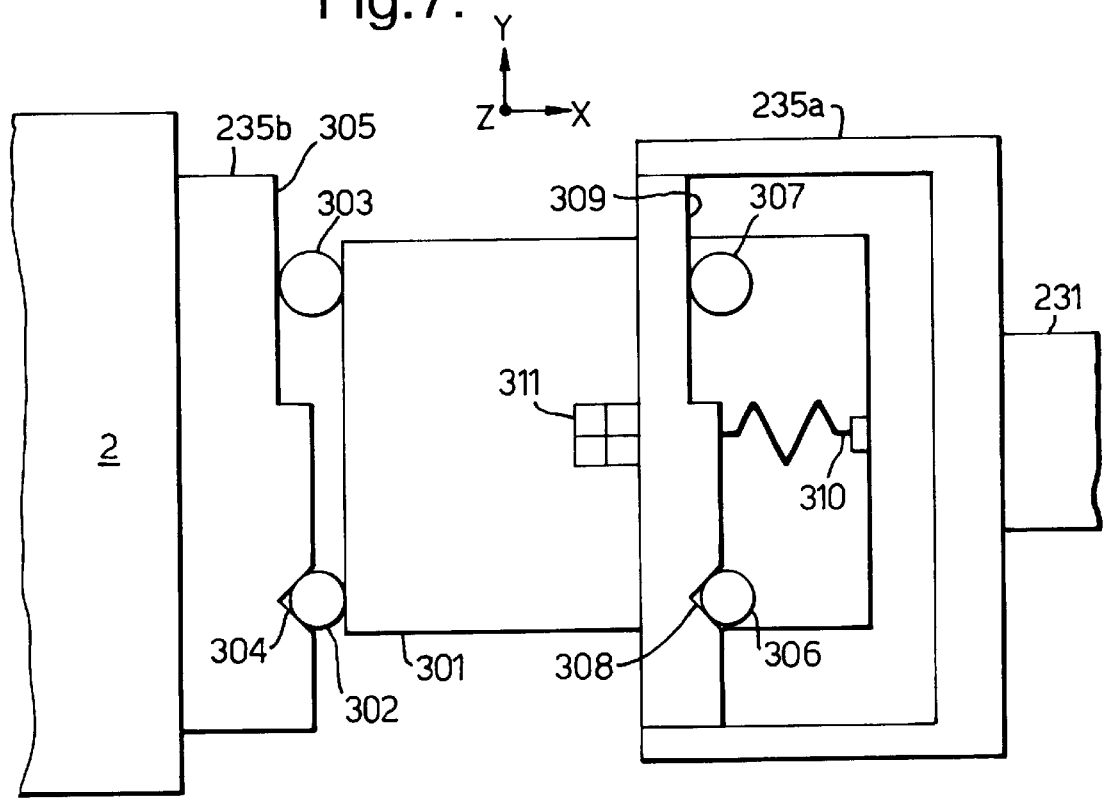
FIG. 7 depicts a coupling mechanism of a third embodiment of the invention.
Figure 8:
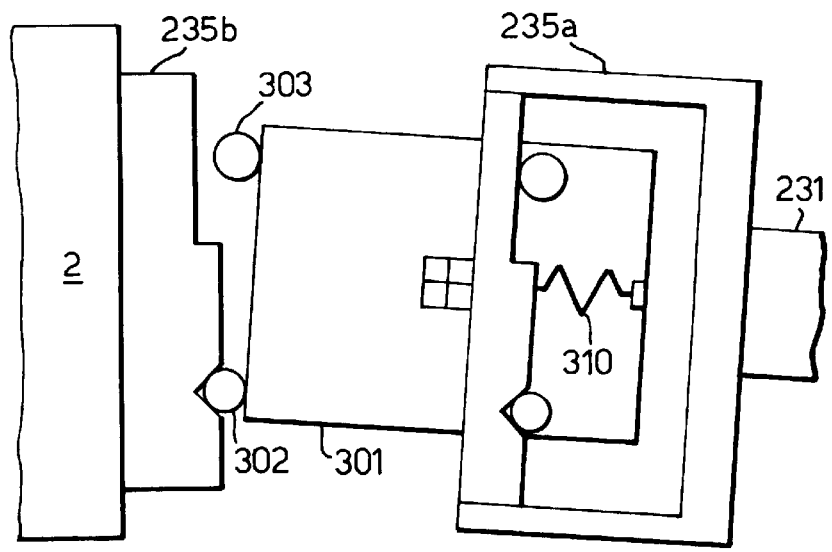
FIG. 8 depicts the coupling mechanism of the third embodiment when the substrate handler is at a slight angle to the pre-aligner.
Figure 9:
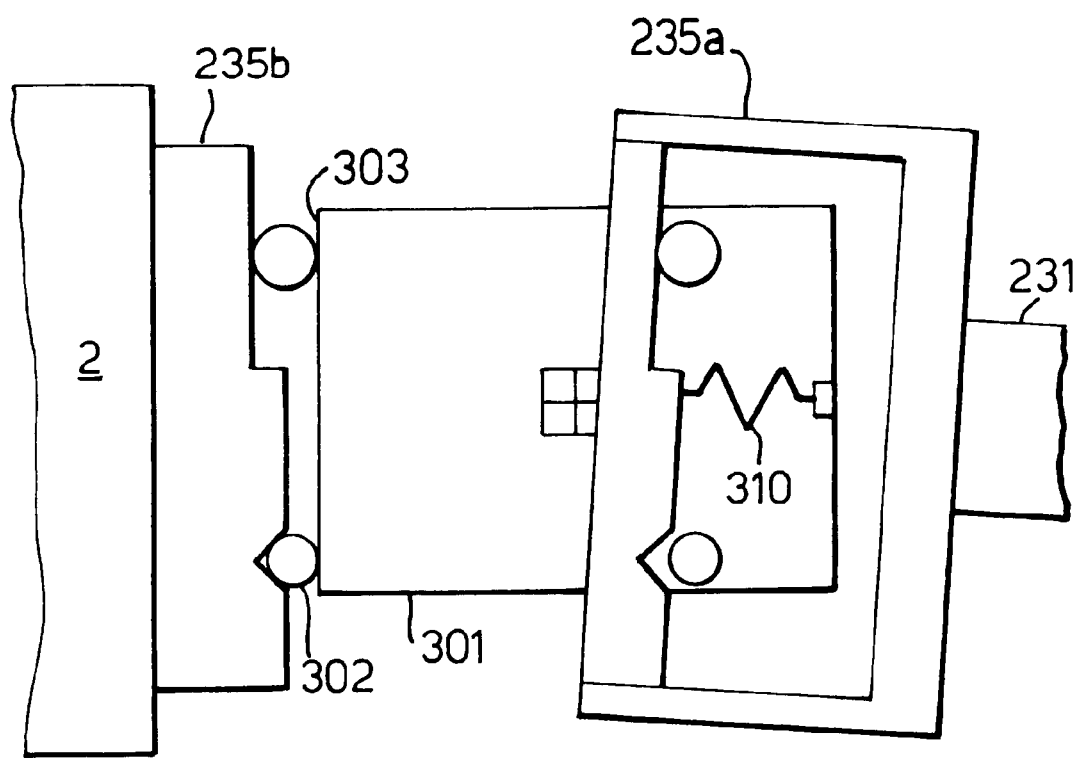
FIG. 9 depicts the coupling mechanism of the third embodiment with the end-effector correctly aligned with the pre-aligner.

A coupling mechanism used in a third embodiment of the invention is shown schematically in FIGS. 7, 8 and 9. Otherwise, the third embodiment is similar in form and function to the first and second embodiment.

As shown in FIG. 7, the coupling means of the third embodiment comprises a frame 235a fixed to a robot arm 231 (substrate handler) and a docking plate 235b fixed to the wafer pre-aligner 2. A similar docking plate is attached to the wafer table WT. An end-effector member 301 is loosely attached to the frame 235a and carries two sets of roller bearings 302, 303 and 306, 307. The first set of roller bearings 302, 303 are arranged so that when the robot arm 231 is brought into dock with the pre-aligner 2, a first roller bearing 302 engages a groove 304 in the docking plate 235b while a second roller bearing 303 bears on the bearing surface 305 on the docking plate 235b. The engagement of the roller bearing 302 with the groove 304 fixes the position of an end-effector member 301 relative to the docking plate 235b in the Y direction while the engagement of the roller bearing 303 the with bearing surface 305 fixes the position of the end-effector member 301 in the X direction. The third and fourth roller bearings 306, 307 of the second set engage a similar groove 308 and surface 309 when the robot arm is correctly aligned so as to similarly fix the position of the end-effector member 301 relative to the frame 235a. A spring 310 couples the end-effector member 301 to the frame 235a and biases it towards the position where roller bearings 306 and 307 respectively engage groove 308 and bearing surface 309. A pick up hand (e.g. the pick up hand 133 of FIG. 5 and 6) for picking-up the wafer is rigidly attached to the end-effector member so that when the end-effector member 301 is guided to the correct position by docking plate 235b, the pick up hand is in the correct position for picking-up the wafer. Misalignment of the end-effector member 301 relative to the frame 235a is detected by quadcell detector 311 and the position or orientation of robot arm 231 can be adjusted accordingly. The quadcell 311 is used to bring the robot arm 231 into coarse alignment with the pre-aligner 2; fine alignment is effected by the end-effector member 301 and the robot arm 231 need only be brought close enough to the correct position to allow the end-effector member 301 to move to correct alignment with the docking plate 235b. The quadcell detector 311 is also used to control whether the spring 310 is compressed enough to ensure that the roller bearings 302 and 303 are pressed against the docking plate 235b with sufficient force.

FIGS. 8 and 9 illustrate how this arrangement is used to ensure correct alignment between the robot arm 231 and pre-aligner 2. If the robot arm 231 approaches the pre-aligner 2 at a slight angle to correct alignment, one of the first and second roller bearings, e. g. roller bearing 302, will engage docking plate 235b first. As the robot arm 231 continues to advance, the end-effector member 301 will be pushed out of alignment with frame 235a as the other of first and second roller bearings 302, 303 comes into engagement with docking plate 235b against the biasing force of spring 310. This is the position shown in FIG. 9. The pick-up hand stiffly attached to the end-effector member 301 is now in the correct position to pick-up the wafer from the pre-aligner 2. It will be noted that this coupling mechanism only locates the robot arm 231 relative to the pre-aligner 2 and wafer table WT in the XY plane. Precise location in Z is not necessary.

As mentioned above, a corresponding docking plate is provided on the wafer table WT for use in loading the wafer W onto the wafer table WT.

While we have described above specific embodiments of the invention it will be appreciated that the invention may be practiced otherwise than as described, for example the invention may also be used in reticle handling. The description is not intended to limit the invention.

What is claimed is:

1. A lithographic projection apparatus, comprising:
   a radiation system constructed and arranged to supply a projection beam of radiation;
   a mask table provided with a mask holder for holding a mask;
   a substrate table provided with a substrate holder for holding a substrate;
   a projection system for imaging an irradiated portion of the mask onto a target portion of the substrate;
   a substrate pre-aligner constructed and arranged to carry out an initial alignment of a substrate, said pre-aligner being mechanically isolated from said substrate table;
   a substrate handler constructed and arranged to transfer a substrate from said pre-aligner to said substrate table; and
   a mechanical coupling that selectively couples said substrate handler to said substrate table at a known relative position.

2. An apparatus according to claim 1, wherein said coupling is further arranged to selectively couple to said pre-aligner at a known relative position.

3. An apparatus according to claim 1 wherein said coupling comprises a docking member loosely mounted to said substrate handler, arranged selectively to couple said member to said pre-aligner and said substrate table.

4. An apparatus according to claim 3 further comprising a biasing member arranged to bias said docking member towards a predetermined position relative to said substrate handler.

5. An apparatus according to claim 1 wherein said coupling structure comprises a first part provided on said substrate handler and two second parts, one provided on each of said pre-aligner and said substrate table, selectively engageable with said first part.

6. An apparatus according to claim 5, wherein said first part comprises a roller bearing and each of said second parts comprises a docking plate having therein a groove with which said roller bearing can be closely engaged.

7. An apparatus according to claim 6 wherein engagement of each roller bearing and each groove defines the relative position of said substrate handler and said pre-aligner or substrate table in a first direction substantially parallel to the plane of said substrate when held in said pre-aligner or said substrate table.

8. An apparatus according to claim 6 wherein said first part further comprises a second roller bearing and said docking plate further defines a bearing surface against which said second bearing can bear to define the relative position of said substrate handler and said pre-aligner or substrate table in a second direction substantially parallel to the plane of said substrate when held in said pre-aligner or said substrate table and substantially perpendicular to said first direction.

9. A method of manufacturing a device comprising:

providing a mask bearing a pattern to a mask table;

providing a substrate having a radiation-sensitive layer to a pre-aligner and preparing it for exposure;

transferring said substrate from said-pre-aligner to a substrate table using a substrate handler by:
  (a) picking up said substrate from said pre-aligner;
  (b) coupling said substrate handler to said substrate table; and
  (c) placing said substrate in said substrate holder of said substrate table; and imaging irradiated portions of the mask onto target portions of the substrate.

10. A device manufactured according to the method of claim 9.

* * * * *